(12) United States Patent
Kim et al.

(10) Patent No.: US 7,833,464 B2
(45) Date of Patent: Nov. 16, 2010

(54) IMPRINTING APPARATUS AND IMPRINTING METHOD

(75) Inventors: Kyu-Young Kim, Suwon-si (KR); Dae-Jin Park, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 195 days.

(21) Appl. No.: 11/971,657

(22) Filed: Jan. 9, 2008

(65) Prior Publication Data

US 2008/0174052 A1 Jul. 24, 2008

(30) Foreign Application Priority Data

Jan. 19, 2007 (KR) .................. 10-2007-0006223

(51) Int. Cl.
*B29C 43/14* (2006.01)
*B29C 35/08* (2006.01)

(52) U.S. Cl. .............. 264/496; 425/174; 977/887; 264/319

(58) Field of Classification Search .......... 264/494, 264/496, 319; 977/887; 425/174.4
See application file for complete search history.

(56) References Cited

U.S. PATENT DOCUMENTS 5,630,902 A  5/1997 Galarneau et al.

| 6,040,118 A * | 3/2000 | Capodieci .............. 430/328 |
| 2004/0086793 A1* | 5/2004 | Sreenivasan et al. ....... 430/22 |
| 2004/0200368 A1* | 10/2004 | Ogino et al. ............. 101/34 |

FOREIGN PATENT DOCUMENTS

| JP | 2000-105380 | 4/2000 |
| KR | 1020050037773 | 4/2005 |
| KR | 1020050075066 | 7/2005 |

OTHER PUBLICATIONS

Tan, H, A. Gilbertson, S. Chou, Roller nanoimprint lithography, J. Vac. Sci. Technol. B, vol. 16, No. 6 (Nov./Dec. 1998), pp. 3926-3928.*

Bender, M. et al., Fabrication of Nanostructures using a UV-based imprint technique, Microelectronic Engineering, vol. 53 (2000), pp. 233-236.*

* cited by examiner

*Primary Examiner*—Matthew J. Daniels
(74) *Attorney, Agent, or Firm*—Innovation Counsel LLP

(57) ABSTRACT

An imprinting apparatus and an imprinting method that prevents movement of an imprinting mold during an imprinting process. The imprinting method includes coating a resin on a substrate; aligning an imprinting mold on the resin; temporarily securing the imprinting mold on the substrate; pressing the imprinting mold; hardening the resin; and detaching the imprinting mold.

10 Claims, 12 Drawing Sheets

IMPRINTING APPARATUS AND IMPRINTING METHOD

CROSS-REFERENCE TO RELATED APPLICATION

The present application claims priority to Korean Patent Application No. 2007-0006223 filed on Jan. 19, 2007, the disclosure of which is incorporated herein by reference in its entirety.

BACKGROUND OF THE INVENTION

1. Field of the Invention

The present invention relates to an imprinting apparatus and an imprinting method, and more particularly, to an imprinting apparatus and an imprinting method capable of preventing the movement of an imprinting mold during an imprinting process.

2. Description of the Related Art

Display devices such as a liquid crystal display (LCD), an organic light emitting display (OLED), and a plasma display panel (PDP), etc. have good display quality and a fast driving speed by individually controlling pixels arranged in a matrix form. For example, the LCD displays a desired image by controlling light transmittance of liquid crystal cells arranged in a matrix form in response to image signal information. These display devices have been widely used in several application fields due to many benefits of a thin, large panel size, low power consumption, and a low driving voltage as flat panel display devices.

The display devices generally use a thin film transistor as a switching element. Fabrication of the fine patterns in a thin film transistor and a display panel require the use of many photolithography processes. The photolithography processes include forming a layer, forming a photoresist, making a mask, exposing, developing, etching, and removing a photoresist, etc., all of which are time-consuming, expensive, and complicated.

Electron-beam, ion-beam, extreme ultraviolet, proximity X-ray, and nano-imprinting have recently been proposed for forming a fine pattern on a substrate without the use of photolithography. The nano-imprinting method forms a desired pattern by stamping the resin applied to a substrate with an imprinting mold or by making an imprinting mold having a desired pattern and then depositing a resin inside the imprinting mold.

The imprinting mold and substrate move with respect to each other so as to exactly form the desired pattern on the substrate. However, it is not easy to align the imprint mold on the substrate with respect to the resin. Further, in the imprinting process, a residual layer may remain after the pattern is formed on the substrate. While the residual layer can be removed by sufficiently raising the pressure, accurate alignment of the imprinting mold requires that the pressure be lowered. However, lowering the pressure is undesirable because residual layers are formed.

SUMMARY OF THE INVENTION

The present invention provides an imprinting apparatus and an imprinting method capable of preventing movement of an imprinting mold relative to the substrate during an imprinting process by temporarily hardening the resin applied to the substrate or by pressing part of the imprinting mold against the substrate.

According to one aspect, the present invention provides an imprinting method including coating a resin on a substrate; aligning an imprinting mold on the resin; temporarily securing the imprinting mold on the substrate; applying pressure to the imprinting mold; hardening the resin; and detaching the imprinting mold from the imprinted resin.

The step of temporarily securing the imprinting mold on the substrate includes temporarily hardening part of the resin that has been applied to the mold.

The step of temporarily hardening a part of the resin includes irradiating part of the resin with ultraviolet rays.

The step of irradiating the ultraviolet rays on part of the resin comprises applying a shadow mask having a plurality of holes to the imprinting mold; irradiating the surface of the shadow mask with ultraviolet rays; and temporarily hardening a part of the resin with the ultraviolet rays transmitted through the plurality of holes.

The step of irradiating part of the resin with ultraviolet rays includes the use of a spot light source.

The step of temporarily hardening part of the resin includes heating part of the imprinting mold.

The step of temporarily hardening part of the resin includes heating part of the imprinting mold and irradiating the heated part with ultraviolet rays.

The step of temporarily securing the imprinting mold to the substrate includes pressing a part of the imprinting mold to the substrate.

The step of pressing the imprinting mold includes pressing the whole surface of the imprinting mold upon the substrate.

The step of pressing the imprinting mold includes sequentially pressing the imprinting mold upon the substrate.

According to another aspect, the present invention provides an imprinting apparatus including: a substrate support for mounting a substrate coated with a resin; an imprinting mold positioned with respect to the substrate support to shape the resin and form a desired pattern; a temporary securing portion for temporarily securing the imprinting mold to the substrate; a pressure portion for pressing the imprinting mold upon the substrate; and a resin hardening portion for hardening the resin on the substrate.

The temporary securing portion includes a temporary hardening portion for temporarily hardening the resin by irradiating part of the resin.

The temporary hardening portion comprises an ultraviolet lamp for irradiating light upon the whole surface of the resin; and a shadow mask formed on the imprinting mold and including a hole.

The shadow mask may include at least two holes.

The temporary hardening portion includes a spot light source for irradiating light upon part of the resin.

More than two spot light sources may be used.

The temporary securing portion may include a thermosetting resin part of which is hardened by heating.

The temporary securing portion includes a protrusion which presses upon part of the imprinting mold.

More than two protrusions may be used.

The pressure portion is a pressure roller sequentially pressing the imprinting mold.

The resin-hardening portion is an ultraviolet lamp.

BRIEF DESCRIPTION OF THE DRAWINGS

The present invention will be described more fully hereinafter with reference to the accompanying drawings, in which.

DETAILED DESCRIPTION

Hereinafter, exemplary embodiments of the present invention will now be described in detail with reference to FIGS. 1 to 15.

Figure 1:
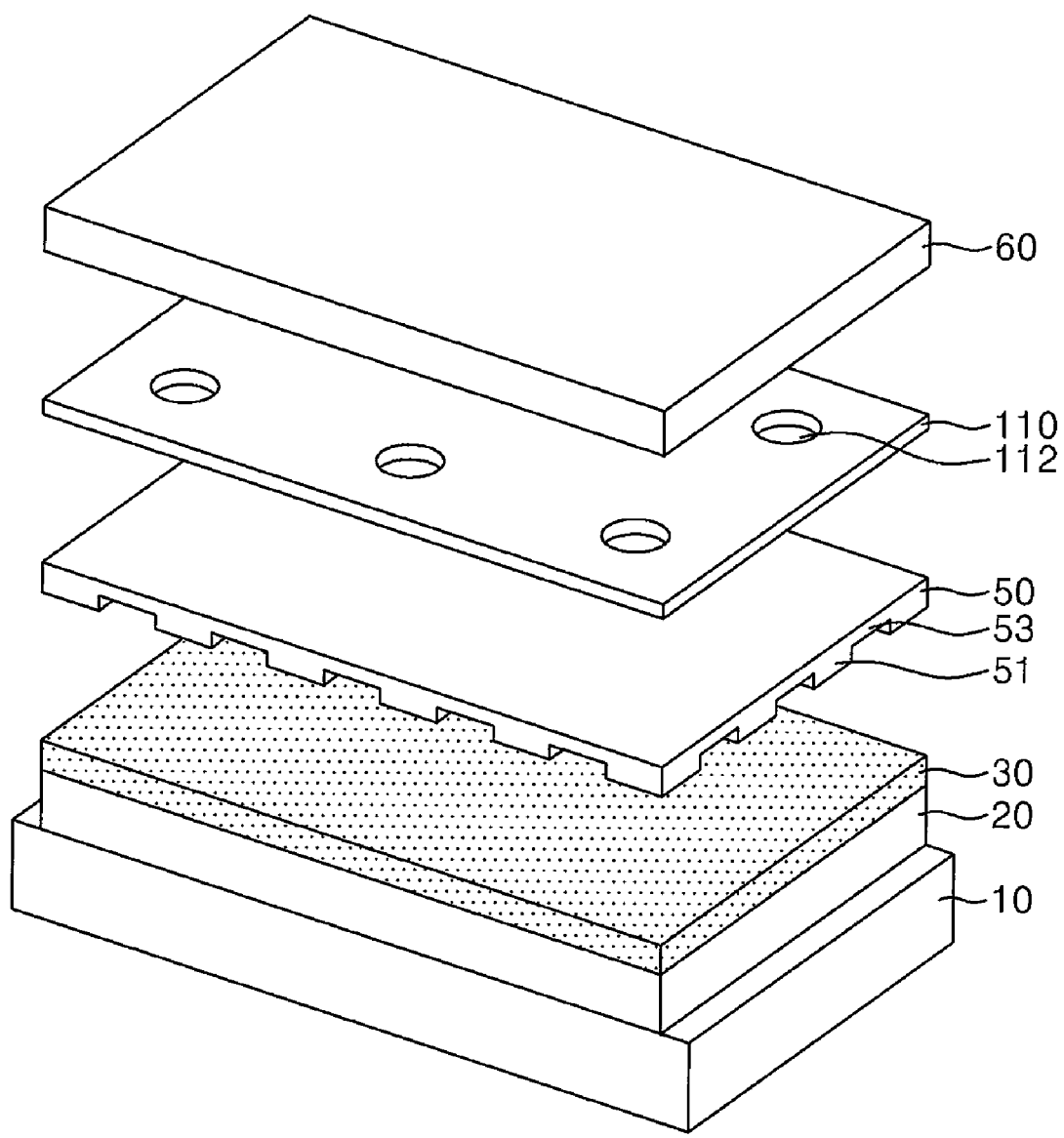
FIG. 1 is a perspective view of an imprinting apparatus in accordance with a first exemplary embodiment of the present invention.

FIG. 1 is a perspective view of an imprinting apparatus in accordance with a first exemplary embodiment of the present invention.

Referring to FIG. 1, an imprinting apparatus includes a substrate support 10, a substrate 20, a resin 30, an imprinting mold 50, a temporary securing portion (not shown), and a resin-hardening portion (not shown).

The substrate 20 is mounted on an upper surface of the substrate support 10. The substrate support 10 further includes a substrate-securing portion (not shown) for securing the substrate 20 mounted thereon. The substrate-securing portion secures the substrate 20 so it does not to move during the imprinting process.

The substrate 20 is mounted on the substrate support 10 and is formed of an insulting material. For example, the substrate 20 may be formed of plastic or glass.

The resin 30 is applied to the substrate 20 and a pattern is formed thereon by the imprinting mold 50. An ultraviolet light may be used for hardening the resin or a thermosetting resin may be used which is hardened by the application of heat.

The imprinting mold 50 forms a predetermined pattern in the resin by pressing upon the resin 30 deposited on the substrate 20. The imprinting mold 50 includes an embossed portion 51 and an intaglio portion 53. The embossed portion 51 contacts the substrate 20 and the intaglio portion 53 is raised above the surface of substrate 20 by a constant distance, thereby shaping a constant pattern of the resin 30.

The imprinting mold 50 may further include a device (not shown) for moving the imprinting mold 50 with respect to aligning locations of the substrate 20. When hardening of the resin 30 is completed the device detaches the imprinting mold 50 from the substrate 20. Alternatively, one edge of the imprinting mold 50 may be tilted to contact the edge of the mold 50 with the substrate 20 by the device.

The temporary securing portion secures the imprinting mold 50 to the resin 30 by temporarily hardening the resin 30 or by pressing the imprinting mold 50 against the substrate during the imprinting process. In this embodiment, the temporary securing portion causes the temporary hardening of a portion of the resin 30 using ultraviolet rays.

As shown in FIG. 1, the temporary hardening includes the use of an ultraviolet lamp 60 for applying irradiating ultraviolet rays to the resin 30 through a shadow mask 110. The shadow mask 110 is formed on the imprinting mold 50 and includes at least two holes 112. The light from the ultraviolet lamp 60 is radiated upon the shadow mask 110 and delivered to the resin 30 through the holes 112 to temporarily harden only that portion of resin 30 irradiated by the ultraviolet rays. Part of the resin 30 is hardened to secure the imprinting mold 50, thereby preventing misalignment of the imprinting mold 50 and the substrate 20.

Figure 2:
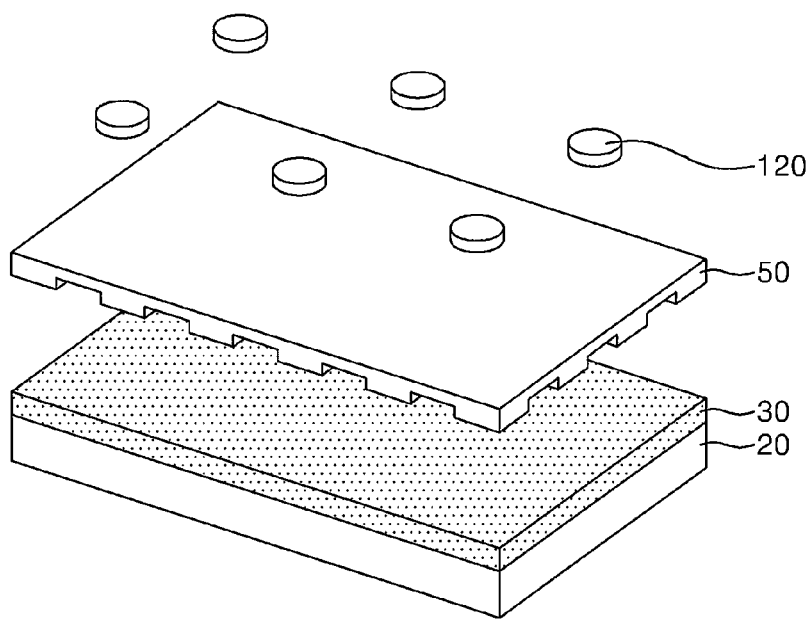
FIG. 2 is a perspective view of an imprinting apparatus in accordance with a second exemplary embodiment of the present invention.

FIG. 2 is a perspective view of the imprinting apparatus in accordance with a second exemplary embodiment of the present invention.

In this embodiment, the temporary securing portion includes an ultraviolet light for temporarily hardening the resin 30. As shown in FIG. 2, the temporary hardening portion is spot light sources 120 irradiating ultraviolet rays to part of the resin 30. The spot light sources 120 are positioned at locations where the resin 30 is to be temporarily hardened. A plurality of the spot light sources 120 may be employed according to the number of locations to be temporarily hardened. It is preferable that more than two spot light sources 120 be used. The use of more than two spot light sources 120 overcomes the possibility of misalignment of the imprinting mold 50 with the substrate 20 due to weaker cohesive force when only one part of the resin 30 is temporarily hardened.

Figure 3:
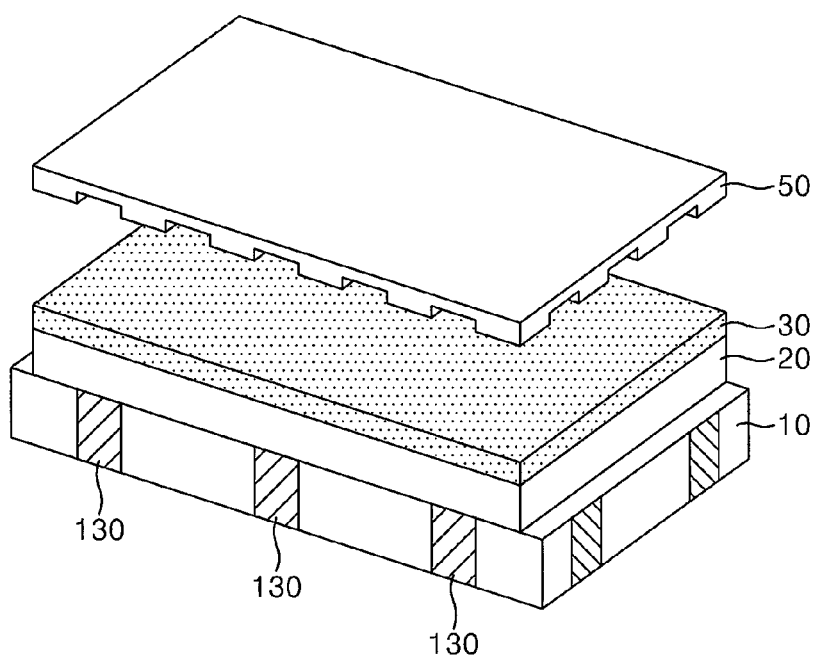
FIG. 3 is a perspective view of an imprinting apparatus in accordance with a third exemplary embodiment of the present invention.

FIG. 3 is a perspective view of the imprinting apparatus in accordance with a third exemplary embodiment of the present invention.

In this embodiment, the temporary securing portion includes a thermosetting portion 130 for temporarily hardening the resin 30 by heating part of the resin 30. As shown in FIG. 3, the thermosetting portion 130 is formed in the substrate-support 10. The thermosetting portion 130 is mounted at a location to be hardened and hardens the resin 30. The thermosetting portion 130 may be formed corresponding to a location of the resin 30 to be temporarily hardened and a plurality of the thermosetting portions 130 may be formed according to the number of locations of the resin to be hardened.

Figure 4:
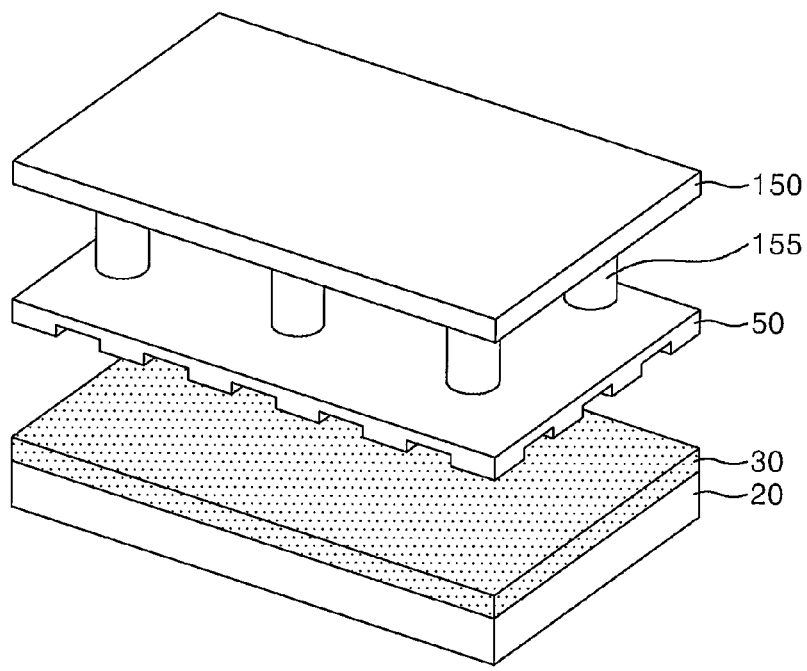
FIG. 4 is a perspective view of an imprinting apparatus in accordance with a fourth exemplary embodiment of the present invention.

FIG. 4 is a perspective view of the imprinting apparatus in accordance with a fourth exemplary embodiment of the present invention.

In this embodiment, the temporary securing portion includes an assistance pressure portion 150 for pressing part of the imprinting mold 50. The assistance pressure portion 150 includes more than two protrusions 155. The imprinting mold 50 is temporarily secured on the substrate 20 by pressing the assistance pressure portion 150 having the protrusions 155 and pressing the imprinting mold 50 at a portion meeting the protrusions 155. As a result, misalignment of the imprinting mold 50 and the substrate 20 may be prevented during the imprinting process.

Figure 5:
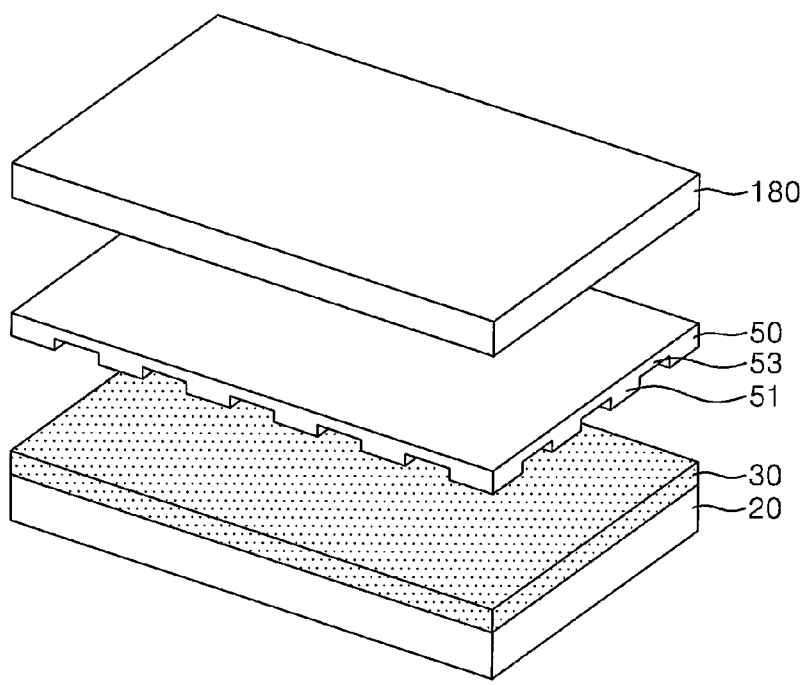
FIGS. 5 and 6 are perspective views for explaining a pressure apparatus of the imprinting apparatus in accordance with the present invention.
Figure 6:
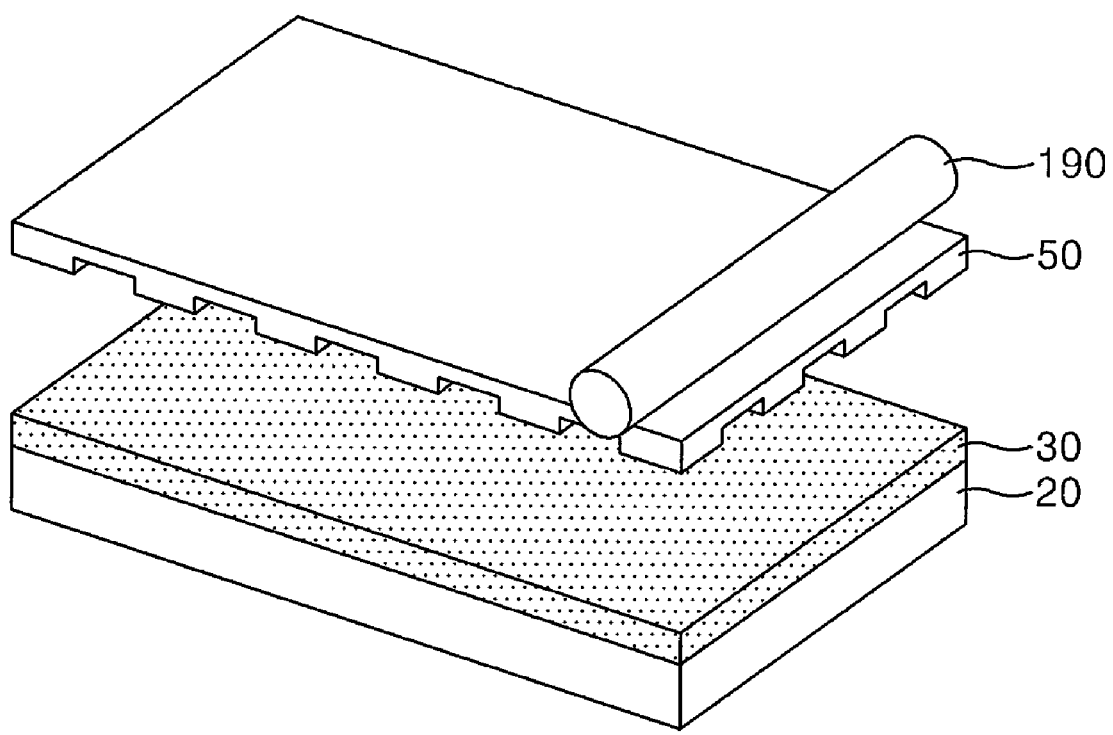

FIGS. 5 and 6 are perspective views of a pressure portion of the imprinting apparatus in accordance with the present invention.

As shown in FIG. 5, the pressure portion includes a pressure portion 180 formed to press the imprinting mold 50. The pressure portion 180 is formed on the imprinting mold 50. The pressure portion 180 presses the imprinting mold 50 at one time by pressing the whole surface of the imprinting mold 50.

The pressure portion, as shown in FIG. 6, includes a pressure roller 190 formed to press the imprinting mold 50. The pressure roller 190 presses the imprinting mold 50 by sequentially pressing the imprinting mold 50.

An imprinting method according to the present invention will now be described in detail with reference to FIGS. 7A to 15.

Figure 7A:
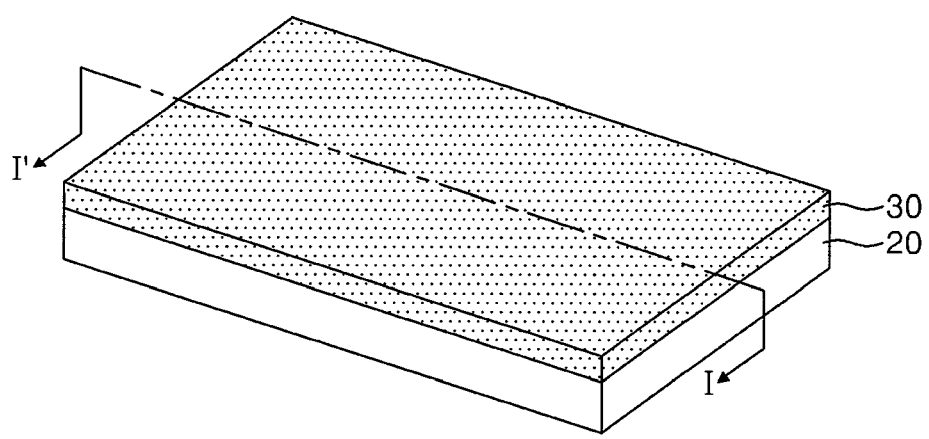
FIGS. 7A and 7B are a perspective view and a cross-sectional view of a first process in the imprinting method in accordance with an exemplary embodiment of the present invention.
Figure 7B:
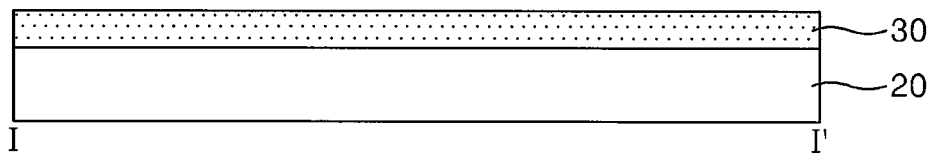

FIGS. 7A and 7B are a perspective view and a cross-sectional view of a first process of the imprinting method in accordance with an exemplary embodiment of the present invention.

Referring to FIGS. 7A and 7B, a constant thickness of the resin layer is formed on the substrate 20. The resin 30 may be an ultraviolet hardening resin or a thermosetting resin, etc. For example, the ultraviolet hardening resin may use liquid phase ultraviolet hardening resin composition composed of acrylate compound which reacts with ultraviolet rays, and sheet-type ultraviolet hardening resin composition composed of a sheet-type ultraviolet hardening resin, etc. including epoxy resin, unsaturated acrylate compound, etc. Coating methods such as spin coating, slit coating, or dispensing, etc. are used to coat the resin 30 on the substrate 20.

When the resin layer is formed on the substrate 20, the resin 30 should be formed so that the amount of the resin 30 coated on the substrate 20 exceeds the amount for filling the intaglio portion 53 of the imprinting mold 50. In the imprinting process, since a pattern is formed at a state that the resin 30 is filled in the intaglio portion 53 of the imprinting mold 50 and the resin 30 is not filled in the embossed portion 51, the amount of the resin 30 sufficient to fill the intaglio portion 53 of the imprinting mold 50 is required to form the exact pattern.

Figure 8A:
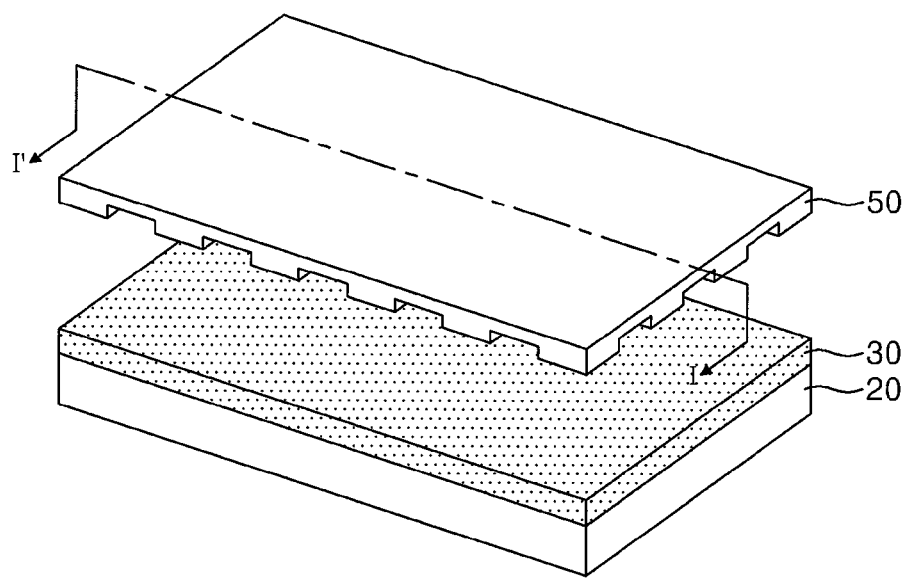
FIGS. 8A and 8B are a perspective view and a cross-sectional view of a second process in the imprinting method in accordance with an exemplary embodiment of the present invention.
Figure 8B:
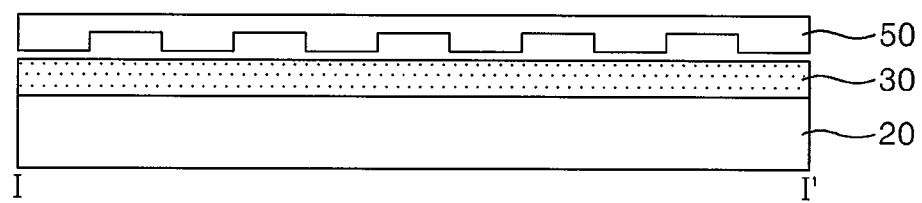

FIGS. 8A and 8B are a perspective view and a cross-sectional view of a second process of the imprinting method in accordance with an exemplary embodiment of the present invention.

Referring to FIGS. 8A and 8B, the imprinting mold 50 is aligned on the substrate 20 in which the resin 30 is coated. More specifically, the imprinting mold 50 is formed on the resin 30 formed on the substrate 20. The imprinting mold 50 may be aligned by the mold movement portion (not shown). Further, the imprinting mold 50 may contact with the resin 30 formed on the substrate 20 by a low pressure.

FIGS. 9A to 12B are perspective views and cross-sectional views of a third process of the imprinting method in accordance with the first to fourth exemplary embodiments of the present invention.

Figure 9A:
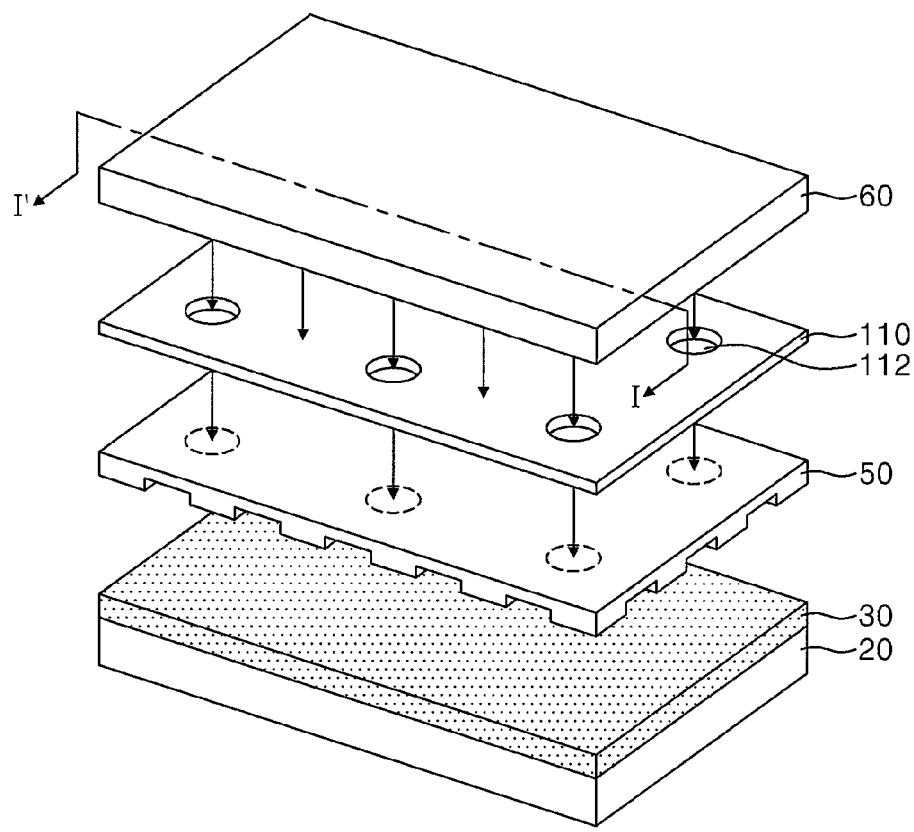
FIGS. 9A to 12B are perspective views and cross-sectional views of a third process in the imprinting method in accordance with first to fourth exemplary embodiments of the present invention.
Figure 9B:
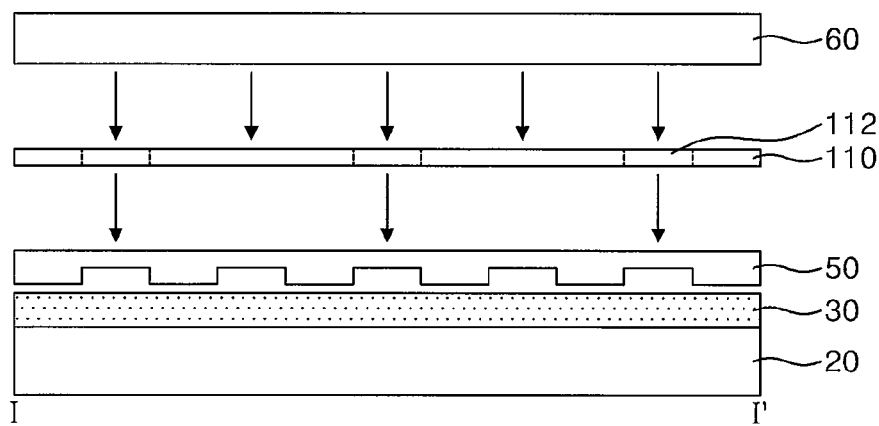

The imprinting mold 50 is aligned on the resin 30, and then temporarily secured. More specifically, the imprinting mold 50 is secured by temporarily hardening or pressing part of the resin 30. FIGS. 9A, 9B, 10A and 10B show a method of temporarily hardening part of the resin 30 by irradiating ultraviolet rays. Referring to FIGS. 9A and 9B, the imprinting mold 50 is aligned on the substrate 20, and then a shadow mask 110 including a plurality of holes 112 is prepared on the imprinting mold 50. Then, an ultraviolet lamp 60 which can irradiate ultraviolet rays on a whole surface is prepared. The ultraviolet rays are irradiated to the shadow mask 110 and delivered to the imprinting mold 50 through the holes 112 formed on the shadow mask 110. The imprinting mold 50 is formed of a transparent high molecular material that can be transmitted by the ultraviolet rays. Accordingly, the resin 30 of the portion irradiated by the ultraviolet rays is temporarily hardened and thus the imprinting mold 50 is temporarily secured on the substrate 20. As a result, the resin 30 is partially hardened during the imprinting process, thereby preventing misalignment of the imprinting mold 50 by temporarily securing the imprinting mold 50 by the partially hardened resin.

Figure 10A:
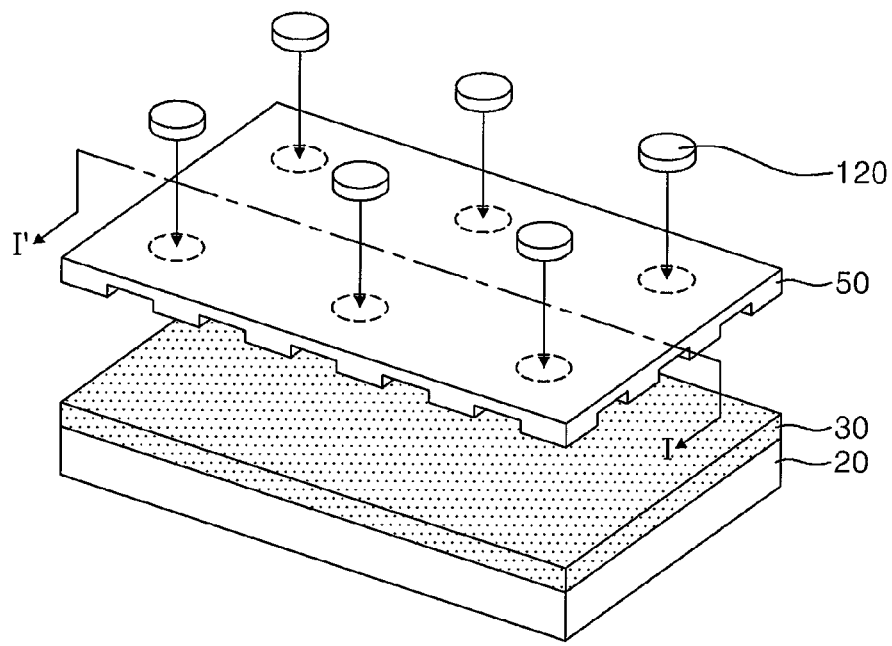
Figure 10B:
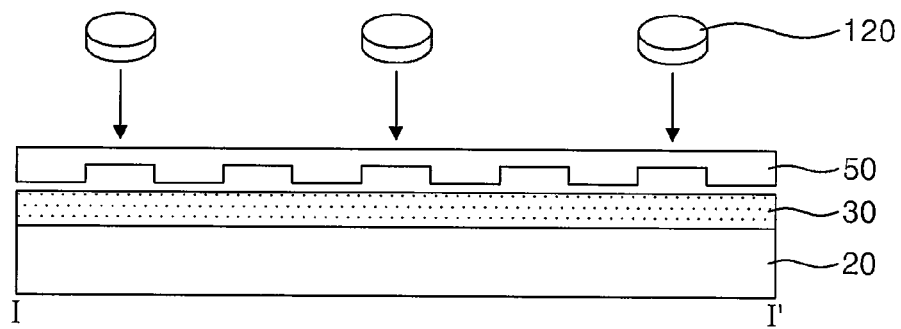

Referring to FIGS. 10A and 10B, the spot light sources 120 are positioned with respect to the imprinting mold 50. Then, ultraviolet rays are irradiated through the spot light sources 120 and delivered to the imprinting mold 50. It is preferable that the imprinting mold 50 is formed of a transparent high molecular weight material that can transmit ultraviolet rays. The resin 30 of the portion irradiated by the spot light sources 120 is temporarily hardened to secure the imprinting mold 50 on the substrate 20.

Figure 11A:
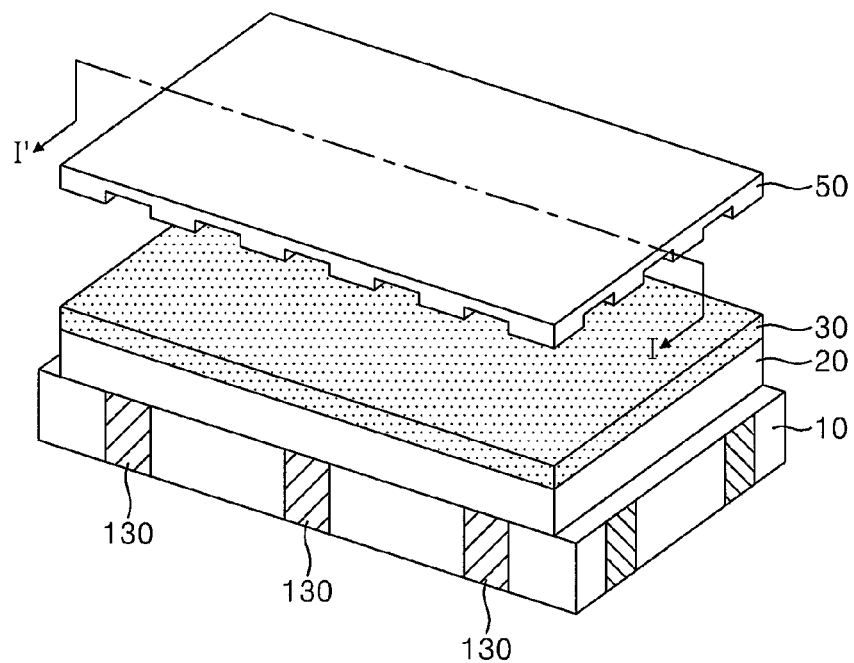
Figure 11B:
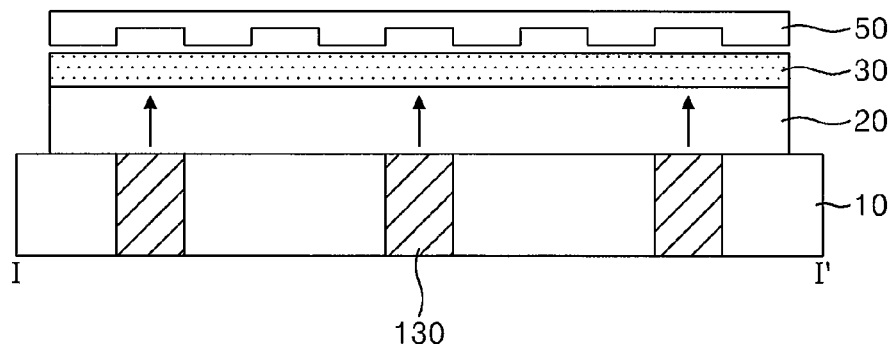

FIGS. 11A and 11B illustrate a method of temporarily hardening part of the resin 30 with heat. The resin 30 is temporarily hardened by the thermosetting portion 130 formed in the substrate support 10. The resin 30 uses the thermosetting resin 30. The imprinting mold 50 is temporarily secured on the substrate 20 by temporarily hardening part of the resin 30. As a result, movement of the imprinting mold 50 during the imprinting process may be prevented.

Although not shown in the drawings, the imprinting mold 50 may be temporarily secured on the substrate 20 by heating and irradiating ultraviolet rays and thus temporarily hardening part of the resin 30.

Figure 12A:
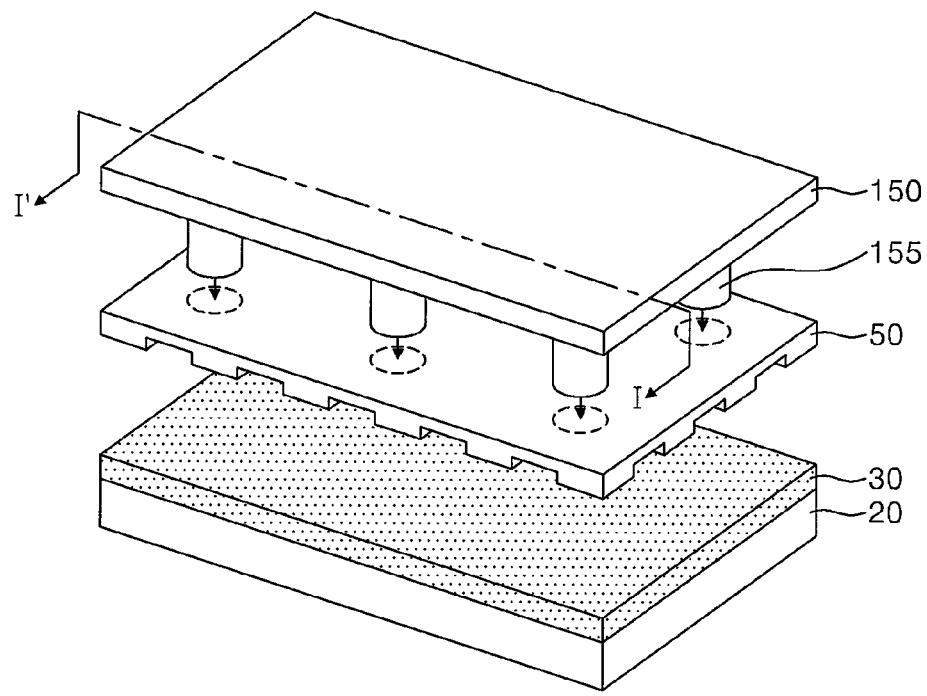
Figure 12B:
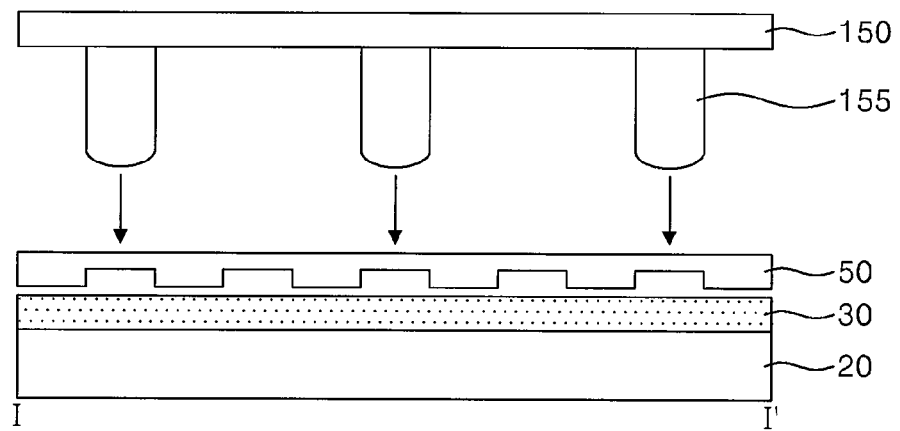

FIGS. 12A and 12B are a method of temporarily hardening part of the imprinting mold 50 on the resin 30. More specifically, part of the imprinting mold 50 is hardened using the assistance pressure portion 150. The assistance pressure portion 150 formed by the plurality of protrusions 155 formed on the imprinting mold 50. Accordingly, when pressure is applied to the assistance pressure portion 150 having the protrusions 155, the imprinting mold 50 is temporarily secured. As a result, misalignment of the imprinting mold 50 may be prevented during the imprinting process, thereby permitting an exact pattern to be formed in the resin.

Figure 13A:
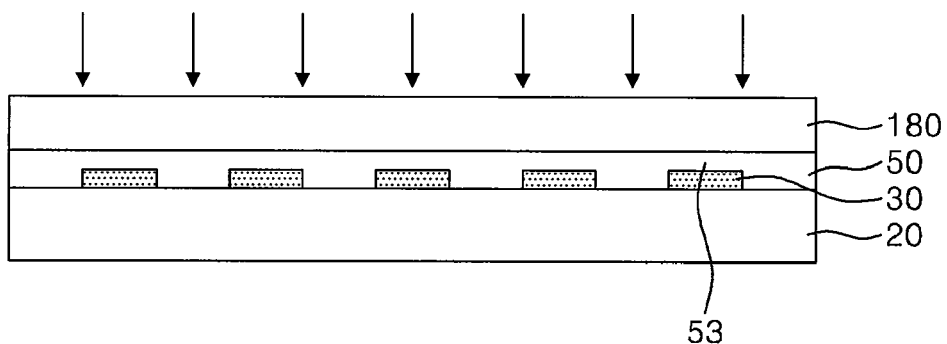
FIGS. 13A and 13B are cross-sectional views of a fourth process in the imprinting method in accordance with an exemplary embodiment of the present invention.
Figure 13B:
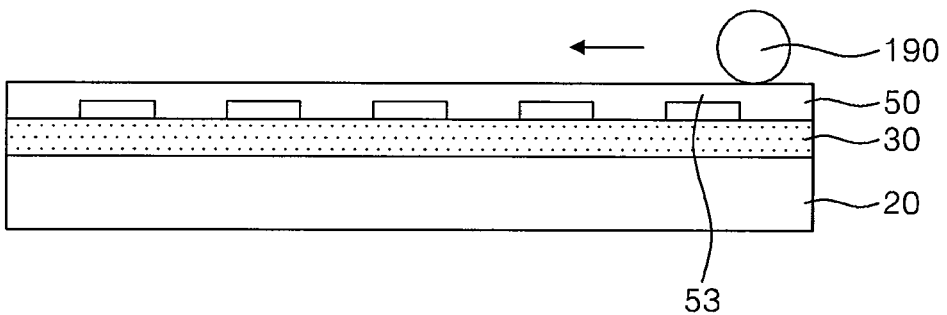

FIGS. 13A and 13B are cross-sectional views of the imprinting method in accordance with an exemplary embodiment of the present invention.

As shown in FIG. 13A, the imprinting mold 50 is temporarily secured, and then the imprinting mold 50 is pressed using the pressure portion 180. The imprinting mold 50 is pressed by applying the pressure portion 180 upon the imprinting mold 50 and pressing the whole surface of the pressure portion 180. Accordingly, the resin 30 formed on the substrate 20 is patterned by the intaglio portion 53 formed on the imprinting mold 50.

After the imprinting mold 50 is temporarily secured, pressure is applied to the imprinting mold 50 using the pressure roller 190 as shown in FIG. 13B. The pressure roller 190 is applied to the imprinting mold 50 and pressure is sequentially applied to the imprinting mold 50 using the pressure roller 190 from one end of the imprinting mold 50. Accordingly, the resin 30 formed on the substrate 20 by the intaglio portion 53 formed in the imprinting mold 50 is patterned.

Figure 14:
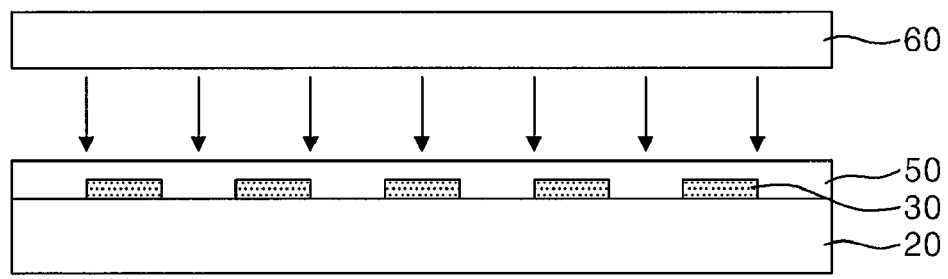
FIG. 14 is a cross-sectional view of a fifth process in the imprinting method in accordance with an exemplary embodiment of the present invention.

Referring to FIG. 14, a resin-hardening portion is formed on the imprinting mold 50. The resin-hardening portion generally uses an ultraviolet lamp 60, heat, etc. and mainly uses the ultraviolet lamp 60. Accordingly, the imprinting mold 50 is formed of a transparent high molecular material that can transmit the ultraviolet rays. For example, in using the ultraviolet lamp 60 as the resin-hardening portion, the ultraviolet lamp 60 is trained on the imprinting mold 50 so as to harden a pattern formed in the resin 30. When the resin 30 is the thermosetting resin, the thermosetting resin 30 is hardened by heating the substrate 20.

Figure 15:
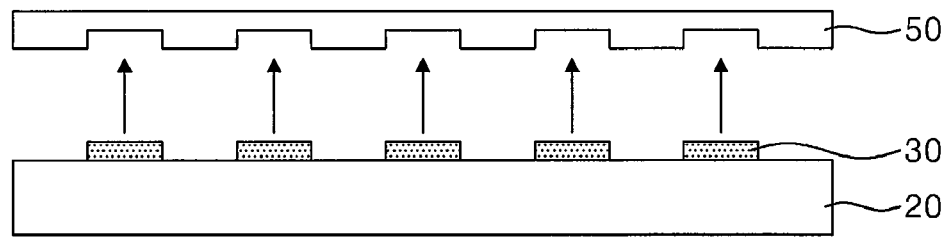
FIG. 15 is a cross-sectional view of a sixth process in the imprinting method in accordance with an exemplary embodiment of the present invention.

FIG. 15 is a cross-sectional view of a sixth process of the imprinting method in accordance with an exemplary embodiment of the present invention.

Referring to FIG. 15, the imprinting mold 50 is detached from the substrate 20. Accordingly, the pattern is formed on the substrate 20. The imprinting mold 50 may be detached from the substrate 20 by the mold movement portion (not shown).

As described above, the imprinting apparatus and the imprinting method according to the present invention temporarily secures the imprinting mold using the temporary securing portion. More specifically, the resin is hardened by irradiating part of the resin with ultraviolet rays and heating the irradiated part of the resin. Further, the part of the imprinting mold is pressed using the assistance pressure portion having the protrusions. As a result, misalignment of the imprinting mold may be prevented by hardening the resin or pressing the imprinting mold during the imprinting process. Further, the imprinting mold is not misaligned, thereby forming the exact pattern on the substrate.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An imprinting method, comprising:
   coating a resin on a substrate;
   aligning an imprinting mold on the resin;
   hardening a part of the resin to secure the imprinting mold on the substrate;
   pressing the imprinting mold against the resin and the hardened part of the resin;
   hardening the remaining resin after the step of pressing; and
   detaching the imprinting mold from the hardened resin.

2. The imprinting method of claim 1, wherein the part of the resin hardened is provided in a plural number.

3. The imprinting method of claim 2, wherein hardening the part of the resin includes irradiating part of the resin with ultraviolet rays.

4. The imprinting method of claim 3, wherein irradiating part of the resin comprises:
   preparing a shadow mask having a plurality of holes in the imprinting mold;
   irradiating ultraviolet rays upon the whole surface of the shadow mask; and
   hardening the resin with the ultraviolet rays transmitted through the plurality of holes.

5. The imprinting method of claim 3, wherein irradiating the ultraviolet rays to the parts of the resin is accomplished through the use of a spot light source.

6. The imprinting method of claim 2, wherein hardening the parts of the resin includes heating parts of the imprinting mold.

7. The imprinting method of claim 2, wherein hardening the parts of the resin includes heating parts of the imprinting mold and irradiating the ultraviolet rays to the heated parts of the imprinting mold.

8. The imprinting method of claim 2, wherein hardening the parts of the resin includes pressing parts of the imprinting mold against the substrate.

9. The imprinting method of claim 1, wherein pressing the imprinting mold includes pressing the whole surface of the imprinting mold.

10. The imprinting method of claim 1, wherein pressing the imprinting mold includes sequentially pressing the surface of the imprinting mold.

\* \* \* \* \*